(12) United States Patent
Liaw

(10) Patent No.: US 8,212,295 B2
(45) Date of Patent: Jul. 3, 2012

(54) ROM CELL CIRCUIT FOR FINFET DEVICES

(75) Inventor: Jhon Jhy Liaw, Hsinchu County (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 184 days.

(21) Appl. No.: 12/827,406

(22) Filed: Jun. 30, 2010

(65) Prior Publication Data

US 2012/0001232 A1     Jan. 5, 2012

(51) Int. Cl.
H01L 31/062 (2006.01)

(52) U.S. Cl. ........ 257/288; 257/296; 257/368; 257/369; 257/E21.294; 365/63; 365/230.5; 365/154; 365/174

(58) Field of Classification Search .................. 257/204, 257/296, 48, 139, 255, 288, 499, 622, 368–369; 365/63, 154, 230.5, 174
See application file for complete search history.

(56) References Cited

U.S. PATENT DOCUMENTS

| | | | |
|---|---|---|---|
| 5,289,432 A | 2/1994 | Dhong et al. | |
| 6,084,820 A | 7/2000 | Raszka | |
| 6,091,626 A | 7/2000 | Madan | |
| 6,181,634 B1 | 1/2001 | Okita | |
| 6,706,571 B1 | 3/2004 | Yu et al. | |
| 6,858,478 B2 | 2/2005 | Chau et al. | |
| 7,002,258 B2 | 2/2006 | Mali et al. | |
| 7,190,050 B2 | 3/2007 | King et al. | |
| 7,247,887 B2 | 7/2007 | King et al. | |
| 7,265,008 B2 | 9/2007 | King et al. | |
| 7,508,031 B2 | 3/2009 | Liu et al. | |
| 7,528,465 B2 | 5/2009 | King et al. | |
| 7,605,449 B2 | 10/2009 | Liu et al. | |
| 7,738,282 B2 | 6/2010 | Liaw et al. | |
| 2005/0153490 A1 | 7/2005 | Yoon et al. | |
| 2005/0247981 A1 | 11/2005 | Wang | |
| 2005/0253287 A1 | 11/2005 | Liaw | |
| 2006/0001058 A1* | 1/2006 | Dreeskornfeld et al. | 257/288 |
| 2007/0018218 A1* | 1/2007 | Kretz et al. | 257/296 |
| 2007/0025132 A1 | 2/2007 | Liaw | |
| 2007/0090428 A1 | 4/2007 | Liaw | |
| 2007/0120156 A1 | 5/2007 | Liu et al. | |

(Continued)

OTHER PUBLICATIONS

Bartlomiej Jan Pawlak, et al., U.S. Appl. No. 12/569,689, "Method of Fabricating Finfet Device," filed Sep. 29, 2009, 21 pages.

(Continued)

*Primary Examiner* — Dung A. Le
(74) *Attorney, Agent, or Firm* — Haynes and Boone, LLP

(57) ABSTRACT

The present disclosure provides a read only memory (ROM) cell array. The ROM cell array includes a plurality of fin active regions oriented in a first direction and formed on a semiconductor substrate; a plurality of gates formed on the plurality of fin active regions and oriented in a second direction perpendicular to the first direction; and a plurality of ROM cells formed by the plurality of fin active regions and the plurality of gates, the plurality of ROM cells being coded such that each cell of a first subset of ROM cells has a source electrically connected to a Vss line, and each cell of a second subset of ROM cells has a source electrically isolated. Each cell of the first subset of ROM cells includes a drain contact having a first contact area and a source contact having a second contact area at least 30% greater than the first contact area.

20 Claims, 10 Drawing Sheets

U.S. PATENT DOCUMENTS

| | | | |
|---|---|---|---|
| 2007/0122953 | A1 | 5/2007 | Liu et al. |
| 2007/0122954 | A1 | 5/2007 | Liu et al. |
| 2007/0128782 | A1 | 6/2007 | Liu et al. |
| 2007/0132053 | A1 | 6/2007 | King et al. |
| 2007/0228372 | A1 | 10/2007 | Yang et al. |
| 2008/0019171 | A1 | 1/2008 | Liaw |
| 2008/0258228 | A1 | 10/2008 | Chuang et al. |
| 2008/0263492 | A1 | 10/2008 | Chuang et al. |
| 2008/0290470 | A1 | 11/2008 | King et al. |
| 2008/0296632 | A1 | 12/2008 | Moroz et al. |
| 2009/0035909 | A1 | 2/2009 | Chang et al. |
| 2009/0181477 | A1 | 7/2009 | King et al. |
| 2010/0006945 | A1 | 1/2010 | Merelle et al. |
| 2010/0006974 | A1 | 1/2010 | Xu et al. |
| 2010/0052059 | A1 | 3/2010 | Lee |
| 2010/0183961 | A1 | 7/2010 | Shieh et al. |
| 2010/0203734 | A1 | 8/2010 | Shieh et al. |
| 2010/0264468 | A1 | 10/2010 | Xu |

OTHER PUBLICATIONS

Hsien-Hsin Lin, et al., U.S. Appl. No. 12/703,918, "Method for Fabricating a Finfet Device," filed Feb. 11, 2010, 40 pages.

Chien-Chang Su, et al., U.S. Appl. No. 12/644,869, "Method for Incorporating Impurity Element in EPI Silicon Process," filed Dec. 22, 2009, 21 pages.

Tsung-Lin Lee, et al., U.S. Appl. No. 12/622,038, "Sacrificial Offset Protection Film for a Finfet Device," filed Nov. 19, 2009, 56 pages.

Jeff J. Xu, et al., U.S. Appl. No. 12/784,207, "Method of Forming EPI Film in Substrate Trench," filed May 20, 2010, 33 pages.

Tian-Choy, et al., U.S. Application No. 12/756,552, "Hybrid Gate Process for Fabricating Finfet Device," filed Apr. 8, 2010, 38 pages.

Ming-Lung Cheng, et al. U.S. Appl. No. 12/780,124, "Method and Apparatus for Enhancing Channel Strain," filed May 14, 2010, 35 pages.

Jhon Jhy Liaw, U.S. Appl. No. 12/823,907, "Cell Structure for Dual-Port SRAM," filed Jun. 25, 2010, 46 pages.

Jhon Jhy Liaw, U.S. Appl. No. 12/823,860, "Structure and Method for SRAM Cell Circuit," filed Jun. 25, 2010, 37 pages.

Jhon Jhy Liaw, et al., U.S. Appl. No. 12/827,690, "Layout for Multiple-Fin SRAM Cell," filed Jun. 30, 2010, 35 pages.

Jeng-Jung Shen, et al., U.S. Appl. No. 12/780,060, "Automatic Layout Conversion for Finfet Device," filed May 14, 2010, 29 pages.

Jeng-Jung Shen, et al., U.S. Appl. No. 12/780,426, "Finfet Boundary Optimization," filed May 14, 2010, 28 pages.

Yu-Lien Huang, et al., U.S. Appl. No. 12,840,830, "High Surface Dopant Concentration Semiconductor Device and Method of Fabricating," filed Jul. 21, 2010, 21 pages.

Peng-Soon Lim, et al., U.S. Appl. No. 12/827,512, "Gate Structures and Method of Fabricating Same," filed Jun. 30, 2010, 41 pages.

Tsu-Hsiu Perng, et al., U.S. Appl. No. 12/837,093, "Fin-Like Field Effect Transistor (Finfet) Device and Method of Manufacturing Same," filed Jul. 15, 2010, 30 pages.

Clement Hsingjen Wann, et al., U.S. Appl. No. 12/834,617, "In-Situ Spectrometry," filed Jul. 12, 2010, 20 pages.

Chia-Chung Chen, et al., U.S. Appl. No. 12/871,476, "Gate Controlled Bipolar Junction Transistor on Fin-Like Field Effect Transistor (Finfet) Structure," filed Aug. 30, 2010, 30 pages.

Jeff J. Xu, et al, U.S. Appl. No. 12/906,820, "Fin-Like Field Effect Transistor (Finfet) Device and Method of Manufacturing Same," filed Oct. 18, 2010, 55 pages.

Jeff J. Csu, et al, U.S. Appl. No. 12/917,902, "Fin-Like Field Effect Transistor (FINFET) Device and Method of Manufacturing Same," filed Nov. 2, 2010, 61 pages.

Mark van Dal, U.S. Appl. No. 12/900,895, "Method of Fabricating a Semiconductor Device Having an Epitaxly Region," filed Oct. 8, 2010, 21 pages.

Hsin-Chih Chen, et al, U.S. Appl. No. 12/907,272, "Multi-Fin Device by Self-Aligned Castle Fin Formation," filed Oct. 19, 2010, 34 pages.

Chien-Hsun Wang, et al, U.S. Appl. No. 12/952,376, "Method for Adjusting Fin Width in Integrated Circuitry," filed Nov. 23, 2010, 27 pages.

Chien-Shun Wang, et al, U.S. Appl. No. 12/949,881, "Method for Forming Metrology Structures From Fins in Integrated Circuitry," filed Nov. 19, 2010, 16 pages.

Chien-Hsun Wang, et al, U.S. Appl. No. 12/953,148, "Device and Method for Forming Fins in Integrated Circuitry," filed Nov. 23, 2010, 39 pages.

Koji Nii et al., "27.9—A 90nm Dual-Port SRAM with 2.04μm² 8T-Thin Cell Using Dynamically-Controlled Column Bias Scheme" ISSCC 2004 / Session 27 / SRAM / 27.9, 2004 IEEE International Solid-State Circuits Conference, 0-7803-8267-6/04, 2004 IEEE, 10 pages.

Application for related matter U.S. Appl. No. 12/823,907, filed Jun. 25, 2010, 46 pages.

Application for related matter U.S. Appl. No. 12/832,860, filed Jun. 25, 2010, 38 pages.

Application for related matter U.S. Appl. No. 12/827,690, filed Jun. 30, 2010, 36 pages.

Application for related matter U.S. Appl. No. 12/721,476, filed Mar. 10, 2010, 37 pages.

* cited by examiner

ROM CELL CIRCUIT FOR FINFET DEVICES

CROSS REFERENCE

The present disclosure is related to the following commonly-assigned U.S. patent applications, the entire disclosures of which are incorporated herein by reference: U.S. patent application Ser. No. 12/721,476, filed Mar. 10, 2010, by the same inventor Jhon Jhy Liaw for "FULLY BALANCED DUAL-PORT MEMORY CELL"; "CELL STRUCTURE FOR DUAL-PORT SRAM" by the same inventor Jhon Jhy Liaw Ser. No. 12/823,907; "STRUCTURE AND METHOD FOR SRAM CELL CIRCUIT" by the same inventor Jhon Jhy Liaw Ser. No. 12/823,860; and "LAYOUT FOR MULTIPLE-FIN SRAM CELL" by the same inventor Jhon Jhy Liaw Ser. No. 12/827,690.

BACKGROUND

To program read only memory (ROM) array chips, contact, via, active region, and/or metal are implemented into (or removed from) a specific portion of selected memory cells. The "on" or "off" state of each memory cell is thus set. Each memory cell is capable of storing a binary bit of data, either in a logic state of "0" or "1" depending on whether the path of bit line to Vss of the memory cell is electrically connected or electrically isolated.

For data sensing of the ROM cells, designers use a simple scheme like a single end circuit (inverter) to detect the data state. If the ROM cell bit line has significant voltage drop (for example, to a lower voltage state from the beginning state) during a read cycle, it will represent a logical value of 1. When the ROM cell bit line keeps a higher voltage similar to the beginning state, it will represent a logical value of 0. Designer are allowed to swap the definition of "0" and "1". However, the voltage differences between the high/low voltages are decided by drive current, leakage, stability and bit-line total capacitance of ROM cells. How to improve these factors is a challenge to future scaling.

For device improvement (drive current, leakage, and device stability), a FinFET device is the best candidate for ROM cell application. This is due to the additional sidewalls device width (for Ion performance) as well as better short channel control (for sub-threshold leakage and matching performance).

However, device performance and reliability are issues when moving to new technology nodes with higher packing density. Therefore, there is a need for a new structure and method for ROM cells to address these concerns for high-end cell application and improved multiple fins cell size.

SUMMARY

The present disclosure provides a read only memory (ROM) cell array. The ROM cell array includes a plurality of fin active regions oriented in a first direction and formed on a semiconductor substrate; a plurality of gates formed on the plurality of fin active regions and oriented in a second direction perpendicular to the first direction; and a plurality of ROM cells formed by the plurality of fin active regions and the plurality of gates. The plurality of ROM cells are coded such that each cell of a first subset of ROM cells has a source electrically connected to a Vss line, and each cell of a second subset of ROM cells has a source electrically isolated. Each cell of the first subset of ROM cells includes a drain contact having a first contact area and a source contact having a second contact area at least 30% greater than the first contact area.

The present disclosure also provides another embodiment of a ROM cell array. The ROM cell array includes a plurality of fin active regions oriented in a first direction and formed on a semiconductor substrate; a plurality of gates formed on the plurality of fin active regions and oriented in a second direction perpendicular to the first direction; and a plurality of ROM cells for data storage and formed by the plurality of fin active regions and the plurality of gates. The plurality of ROM cells are coded such that each cell of a first subset of ROM cells has a source electrically connected to a Vss line, and each cell of a second subset of ROM cells has a source electrically isolated. Each of the plurality of ROM cells includes at least two fin field-effect transistors (FinFETs) formed on respective fin active regions and respective cross-points of the fin active regions and the gates. Each of the plurality of ROM cells also includes a first space between two adjacent intra-cell fin active regions and a second space between two adjacent inter-cell fin active regions. A ratio between the second space and the first space is greater than 1.5. Each of the FinFETs includes a gate electrically connected to a word line, and a drain electrically connected to a bit line.

The present disclosure also provides another embodiment of a ROM cell array. The ROM cell array includes a plurality of fin active regions oriented in a first direction and formed on a semiconductor substrate; a plurality of gates formed on the plurality of fin active regions and oriented in a second direction perpendicular to the first direction; and a plurality of ROM cells for data storage and formed by the plurality of fin active regions and the plurality of gates. The plurality of ROM cells are coded such that each cell of a first subset of ROM cells has a source electrically connected to a Vss line, and each cell of a second subset of ROM cells has a source electrically isolated. Each of the plurality of ROM cells includes a first space between two adjacent intra-cell fin active regions and a second space between two adjacent inter-cell fin active regions. A ratio between the second space and the first space is greater than 1.5. Each of the plurality of ROM cells includes at least two fin field-effect transistors (FinFETs) formed on respective fin active regions and respective cross-points of the fin active regions and the gates. The drains of the at least two FinFETs are electrically connected by a silicide feature formed on a silicon epitaxy feature.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

Figure 1:
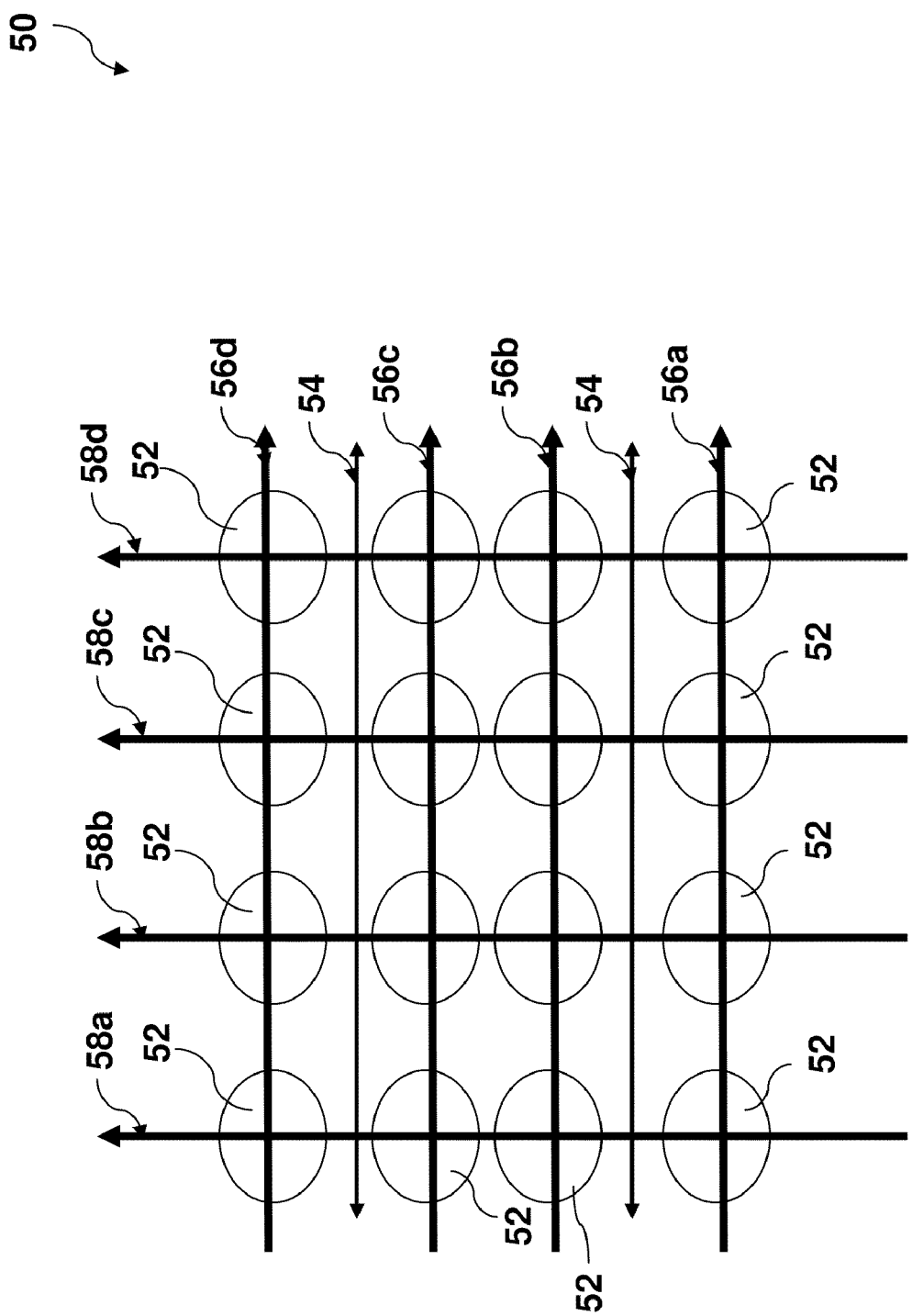
FIG. 1 is a schematic view of a read only memory (ROM) cell array constructed according to various aspects of the present disclosure in one embodiment.

It is to be understood that the following disclosure provides many different embodiments, or examples, for implementing different features of various embodiments. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

For high-speed application, the present disclosure uses multiple fins to improve ROM cell current and devices matching performance. The present disclosure proposes a multiple-space fin structure to reduce cell size. The multi-space fin structure has a narrower fin space for intra-cell and a wider fin space for adjacent cells. For intra-cell drain or source nodes connection, Si-epi with a silicide layer is implemented for the narrower fin space.

To reduce bit-line capacitance, the present disclosure uses source side coding with asymmetry contact (or via) structure to reduce capacitance as well as lower contact resistance, and increase stability, on the coding side. The drain side of the pass device uses a regular (square or circle) single contact as the connection path for bit-line to pass device. But source side of pass device uses longer contact shape for contact resistance reduction as well as yield improvement.

FIG. 1 is a schematic view of a read-only memory (ROM) cell array 50. The ROM cell array 50 includes a plurality of ROM cells 52 configured to form a two-dimensional array. In an exemplary embodiment, the ROM cell array 50 includes 4 columns (X, X+1, X+2, and X+3) and 4 rows (N, N+1, N+2, and N+3). The ROM cells 52 are formed with fin field-effect transistors (FinFETs). In the present embodiment, the ROM cells 52 are mask ROM cells. In another embodiment, one ROM cell includes more than one transistor. In one embodiment, each FinFET is a pass device. In existing ROM technologies, each cell includes only one transistor. In yet another embodiment, the ROM cells 52 utilize n-type metal-oxide-semiconductor (MOS) transistors for device performance with high carrier mobility.

The ROM cell array 50 includes various interconnect features configured and routed to form functional ROM cells for data storage and data access. The various interconnect features include contacts and vias for vertical interconnection, and metal lines for horizontal interconnection. In the present embodiment, the ROM cell array 50 includes Vss lines 54 configured to connect to the sources of transistors in the ROM cells 52. The Vss lines 54 serve as cell voltage (e.g., ground) suppliers. The ROM cell array 50 also includes word lines 56a, 56b, 56c and 56d configured and connected to the gates of transistors in the ROM cells 52. For example, the word lines 56a, 56b, 56c and 56d are connected to ROM cells in the N, N+1, N+2 and N+3 rows, respectively. The ROM cell array 50 also includes bit lines 58a, 58b, 58c and 58d configured and connected to the drains of transistors in the ROM cells 52. For example, the bit lines 58a, 58b, 58c and 58d are connected to ROM cells in the X, X+1, X+2 and X+3 rows, respectively. Various ROM cells may be configured and fabricated to different logic states of "0" and "1" according to different applications. Each cell of the ROM cell array 50 includes asymmetric contacts and different spaces further explained with reference to FIG. 2.

Figure 2:
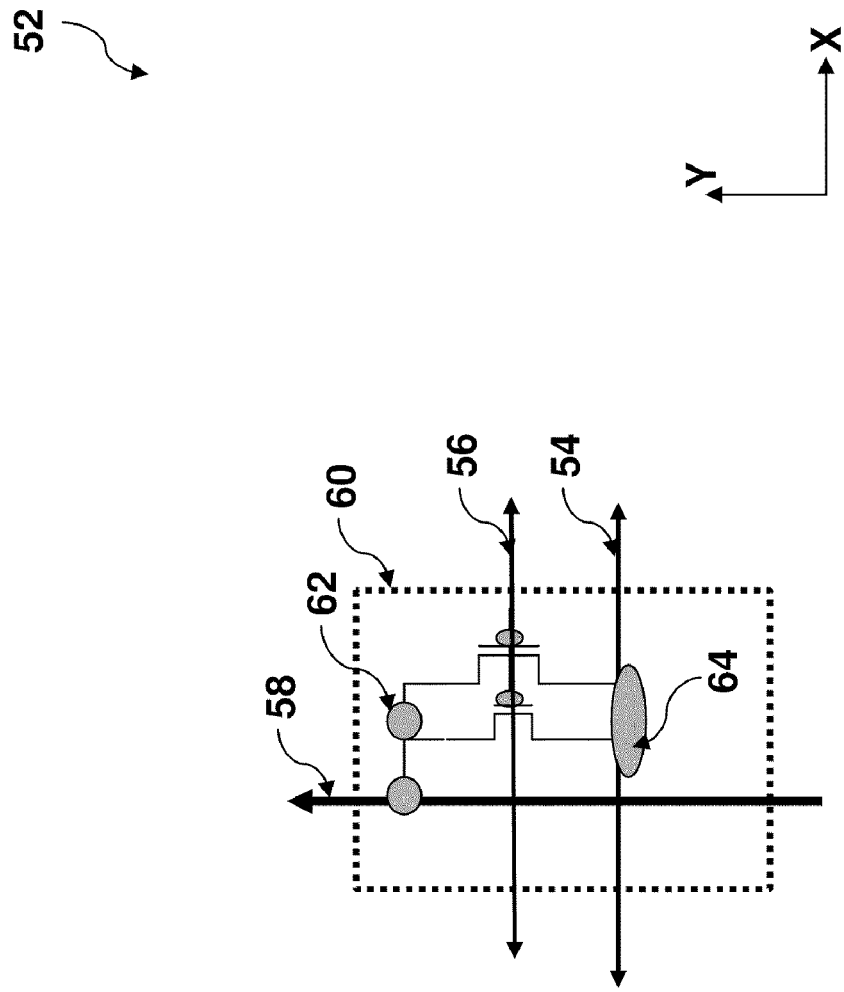
FIG. 2 is a schematic view of a ROM cell constructed according to various aspects of the present disclosure in one embodiment.

FIG. 2 is a schematic view of a ROM cell 52 constructed according to various aspects in one embodiment. The cell boundary 60 of the ROM cell 52 is illustrated by a dashed line. The ROM cell 52 includes multiple FinFETs configured in parallel. The multiple FinFETs are formed over multiple fin active regions. The FinFETs configured in parallel have the sources electrically connected, the drains electrically connected and gates electrically connected as illustrated in FIG. 2. In the present embodiment, the ROM cell 52 includes two FinFETs, such as n-type FinFETs (nFinFETs). Particularly, the sources of the FinFETs in the ROM cell 52 are electrically connected and coupled to the Vss power line 54. The gates of the FinFETs in the ROM cell 52 are electrically connected and coupled to the word line 56. The drains of the FinFETs in the ROM cell 52 are electrically connected and coupled to the bit line 58.

Furthermore, the ROM cell 52 includes a first contact 62 coupling the drains of the FinFETs in the ROM cell 52 to the bit line 58 and a second contact 64 coupling the sources of the FinFETs in the ROM cell 52 to the Vss line 54. The contacts are conductive features designed to connect doped features (or gates) to the metal lines. The first and second contacts 62 and 64 are designed with different dimensions and/or geometries. In top view of the contacts, the first contact 62 has a first contact area A1 and the second contact 64 has a second contact area A2 greater than the first contact area A1. In one embodiment, the second contact area A2 is at least 30% greater than the first contact area A1. In this embodiment, the A2/A1 ratio is greater than 1.3.

In a top view of the contacts, two perpendicular directions X and Y are defined. The fin active regions are oriented along the Y direction. The first contact 62 includes a first dimension along the X direction and a second direction along the Y direction. The first and second dimensions are substantially the same. For example, in a top view, the first contact 62 has geometry of a square or round shape. The second contact 64 includes a third dimension along the X direction and a fourth dimension along the Y direction. The third and fourth dimensions are substantially different. Particularly, the third dimension (longer dimension) is substantially greater than the fourth dimension (shorter dimension). In one embodiment, the third dimension is at least 30% greater than the fourth dimension. In other words, the ratio between the longer dimension and the short dimension of the second contact 64 is greater than 1.3. For example, in a top view, the second contact 64 has a geometry of a rectangle or ellipse shape. The sources of the transistors use a long contact shape to reduce contact resistance as well as improve yield. In another embodiment, the ratio between the longer dimension and the shorter dimension of the second contact 64 is greater than 1.5. In yet another embodiment, the ratio between the longer dimension and the shorter dimension of the second contact 64 is greater than 2.

Figure 3:
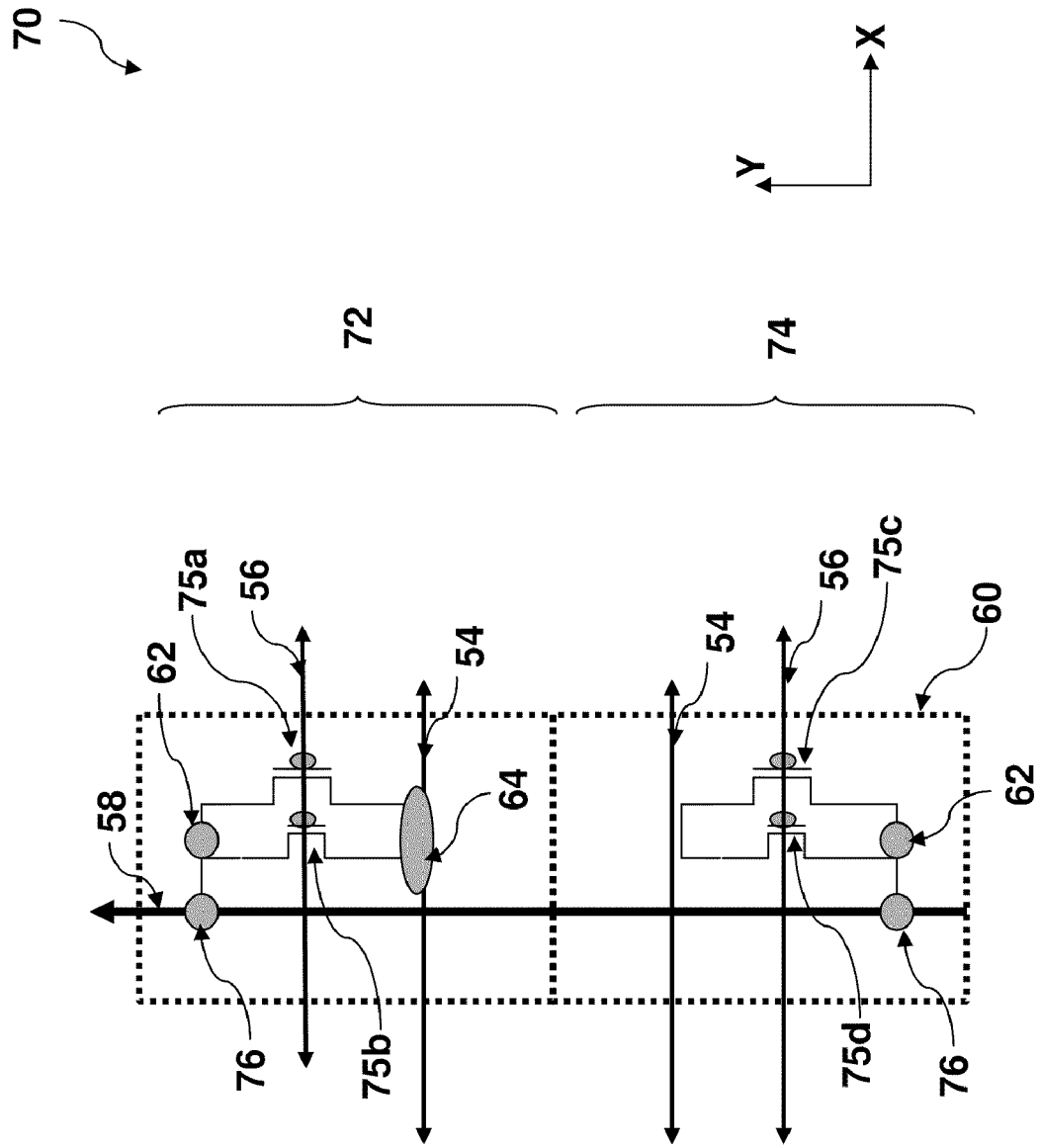
FIGS. 3 and 4 are schematic views of two ROM cells constructed according to various aspects of the present disclosure in various embodiments.

FIG. 3 is a schematic view of a ROM array 70 having two ROM cells 72 and 74 constructed according to various aspects of another embodiment. The cell boundaries 60 of the ROM cells 72 and 74 are illustrated by dashed lines. In various embodiments, different ROM cells are designed and coded to different logic states.

In the present embodiment, the ROM cell 72 is configured to a logic state of "1," and the ROM cell 74 is configured to a logic state of "0." The ROM cell 72 includes multiple FinFETs configured in parallel. In the present embodiment, the ROM cell 72 includes two FinFETs 75a and 75b. Each FinFET 75a and 75b includes a source, a drain, and a gate. Particularly, the sources of the FinFETs 75a and 75b in the ROM cell 72 are electrically coupled to the power line Vss 54. The gates of the FinFETs 75a and 75b in the ROM cell 72 are electrically coupled to the word line 56. The drains of the FinFETs 75a and 75b in the ROM cell 72 are electrically coupled to the bit line 58.

The ROM cell 72 includes a first contact 62 coupling the drains of the FinFETs 75a and 75b to the bit line 58, and a second contact 64 coupling the sources of the FinFETs 75a and 75b to the Vss line 54. The first and second contacts 62 and 64 are designed with different geometries. In a top view of those contacts, two perpendicular directions X and Y are defined. The fin active regions are oriented along the Y direction. The first contact 62 includes a first dimension along the X direction and a second dimension along the Y direction. The first and second dimensions are substantially the same. For example, in a top view, the first contact 62 has a geometry of a square or round shape. The second contact 64 includes a third dimension along the X direction and a fourth dimension along the Y direction. The third and fourth dimensions are substantially different. Particularly, the third dimension is substantially greater than the fourth dimension. For example, in a top view, the second contact 64 has a geometry of a rectangle or ellipse shape.

The ROM cell 74 includes multiple FinFETs configured in parallel. In the present embodiment, the ROM cell 74 includes two FinFETs 75c and 75d. Each FinFET 75c and 75d includes a source, a drain, and a gate. Particularly, the sources of the FinFETs 75c and 75d are electrically isolated, and are not coupled to the power line Vss 54. The gates of the FinFETs 75c and 75d are electrically coupled to the word line 56. The drains of the FinFETs 75c and 75d are electrically coupled to the bit line 58. In this case, as noted above, the ROM cell 72 is coded to logic "1" state, and the ROM cell 74 is coded to logic "0" state. Therefore, there is no source contact in the ROM cell 74.

The ROM cell array 70 further includes vias 76 configured to couple the bit line 58 and the drains. The vias are vertical conductive features designed to couple different metal layers. In this example, the Vss lines 54 and the word lines 56 are formed in a first metal layer and are oriented in one direction (such as the X direction), and the bit lines 58 are formed in a second metal layer and are oriented in another direction (such as the Y direction). In furtherance of the present embodiment, the second metal layer is over the first metal layer. The drains of the FinFETs 75a, 75n, 75c, and 75d are therefore coupled to the bit line 58 through the vias 76.

The FinFETs 75a, 75b 75c, and 75d are formed on different fin active regions. In the present embodiment, the various fin active regions are oriented along the Y direction. The FinFETs 75a and 75b are formed on two fin active regions parallel configured in the ROM cell 72. The FinFETs 75c and 75d are formed on two fin active regions parallel configured in the ROM cell 74. The two fin active regions associated with the FinFETs 75a and 75b are separated from the two fin active regions associated with the FinFETs 75c and 75d.

Figure 4:
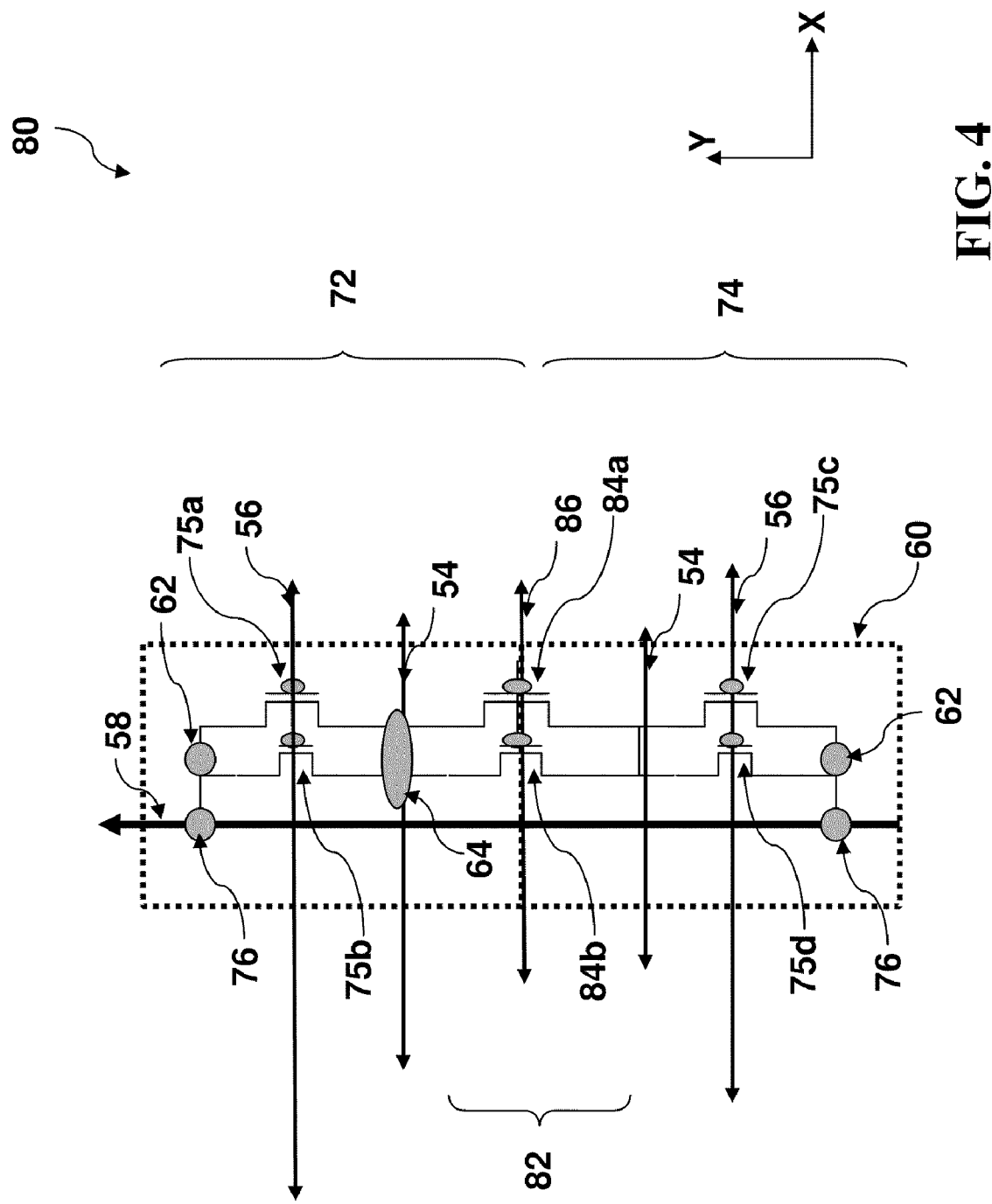

FIG. 4 is a schematic view of a ROM array 80 having two ROM cells 72 and 74 constructed according to various aspects of another embodiment. The ROM array 80 is similar to the ROM array 70 of FIG. 3. For example, different ROM cells are designed and coded to different logic states. In the present example, similar to ROM cell 70, the ROM cell 72 is configured to a logic state of "1", and the ROM cell 74 is configured to a logic state of "0". The ROM cells 72 and 74 are similar to that described above with reference to FIG. 3.

The ROM array 80 is different from the ROM array 70 of FIG. 3. For example, the ROM cell 80 includes an isolation feature 82 and other distinctive features as elaborated below. The isolation feature 82 includes one or more FinFETs interposed between the FinFETs 75a, 75b of the ROM cell 72 and the FinFETs 75c, 75d of the ROM cell 74 for isolation. In the present embodiment, the isolation feature 82 includes two FinFETs 84a and 84b. Each FinFET 84a and 84 b includes a source, a drain, and a gate. The gates of the isolation FinFETs 84a and 84b are electrically grounded. For example, the gates of the isolation FinFETs 84a and 84b are electrically connected to a Vss line 86.

The ROM array 80 includes one or more long fin active regions continuously oriented along the Y direction and extending from the first ROM cell 72 to the second ROM cell 74. In the present embodiment, the ROM array 80 includes two (first and second) long fin active regions (not shown). The FinFETs 75a, 75c, and 84a are formed on the first long fin active region. The isolation FinFET 84 isolates the FinFETs 75a and 75c from each other. The FinFETs 75b, 75d, and 84b are formed on the second long fin active region. The isolation FinFET 84b isolates the FinFETs 75b and 75d from each other.

FIGS. 5 through 8 are top views of a ROM cell array 100 at different stages of fabrication according to various aspects of the present disclosure in various embodiments. In one embodiment, the ROM cell array 100 is a top view of the ROM cell array 50 in one embodiment. The ROM cell array 100 includes a plurality of ROM cells configured as an array for data storage and access. In the present embodiment, the ROM cells in the ROM cell array 100 are configured in four rows and four columns with a total of 16 ROM cells. The four rows are labeled as "N", "N+1", "N+2" and "N+3," respectively. The four columns are labeled as "X", "X+1", "X+2" and "X+3," respectively. "N" and "X" can be any proper integer numbers. Therefore, the ROM cell array 100 can be a subset of another ROM cell array. One exemplary ROM cell is labeled with numeral 52 and has a unit cell boundary 60. Each ROM cell includes multiples FinFETs, such as n-type FinFETs. In the present embodiment, each cell includes two FinFETs.

The ROM cell array 100 includes a plurality of fin active regions 102. Each ROM cell includes two or more fin active regions disposed within or partially within the cell to form two or more FinFETs. The fin active regions disposed within or partially within one ROM cell are referred to as intra-cell fin active regions. Relatively, two adjacent fin active regions disposed in different ROM cells are referred to as inter-cell fin active regions. In one embodiment, the intra-cell fin active regions are oriented in parallel and configured side by side. In various embodiments, the intra-cell fin active regions may span within one ROM cell or alternatively extend to adjacent ROM cell(s).

Figure 5:
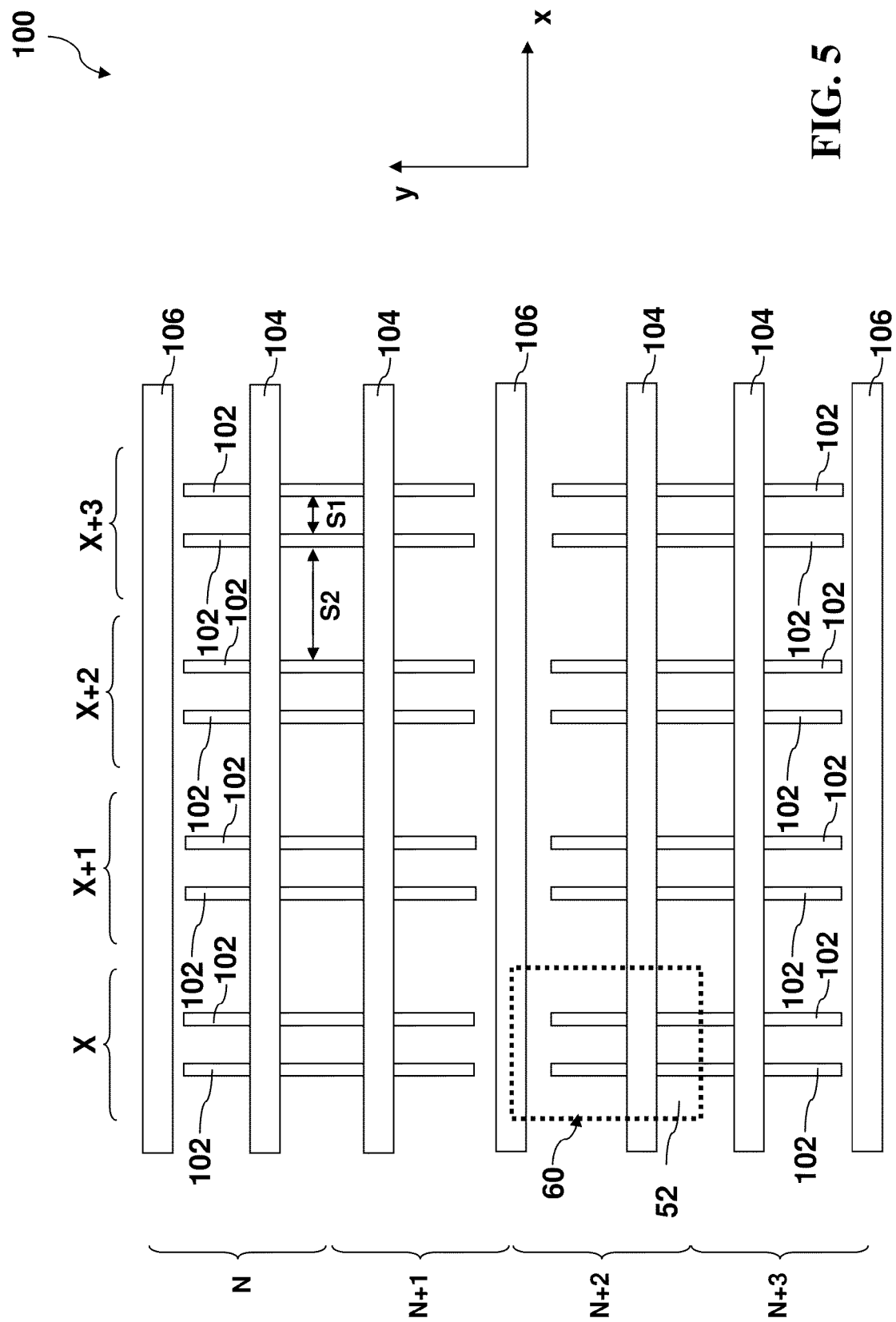
FIGS. 5 to 8 are top views of a ROM cell array constructed according to various aspects of the present disclosure in various embodiments.

In the present embodiment, each ROM cell (such as the ROM cell 52) include two fin active regions 102, forming two FinFETs in each ROM cell. The two intra-cell fin active regions extend along the Y direction through two adjacent ROM cells as illustrated in FIG. 5. The fin active regions 102 are oriented in the Y direction and are configured with two difference spaces, in which a space refers to a distance between two adjacent fin active regions along a direction perpendicular to the orientation of the fin active regions. In this case, the space is the distance between two adjacent fin active regions along the X direction. The intra-cell fin active regions include a first space S1, and inter-cell fin active regions include a second space S2. The second space S2 is substantially greater than the first space S1. In one embodiment, the ratio between the second space S2 and the first space S1 is greater than 1.5.

The ROM cell array 100 includes a plurality of gates 104 formed on the plurality of fin active regions 102 configured to form various ROM cells. The gates 104 are disposed in parallel and oriented in a direction perpendicular to the fin active regions 102. In the depicted embodiment, the gates 104 are oriented in the X direction. Each gate may extend to multiple cells. For example, each gate 104 extends through four columns of ROM cells. In one embodiment, the ROM cell array 100 further includes dummy gates 106 disposed on the isolation features for pattern uniformity, manufacturing enhancement, and/or device performance improvement. The dummy gates 106 are oriented in the same direction with the functional gates 104. The functional gates 104 and dummy gates 106 each include a gate dielectric layer and a gate electrode disposed on the gate dielectric layer. In one embodiment, the dielectric layer includes silicon oxide and the gate electrode includes doped polysilicon. In another embodiment, the gate dielectric layer includes a high-k dielectric material layer and the gate electrode includes a metal. The gate dielectric layer may further include an interfacial layer, such as a silicon oxide layer. The gate electrode layer may further include a metal or metal alloy layer having a proper work function for the respective FinFET (such as n-type FinFET) such that the FinFET has a minimized threshold voltage and improved device performance. The gates having a high-k dielectric material layer and a metal layer can be formed by a gate-replacement process.

Figure 6:
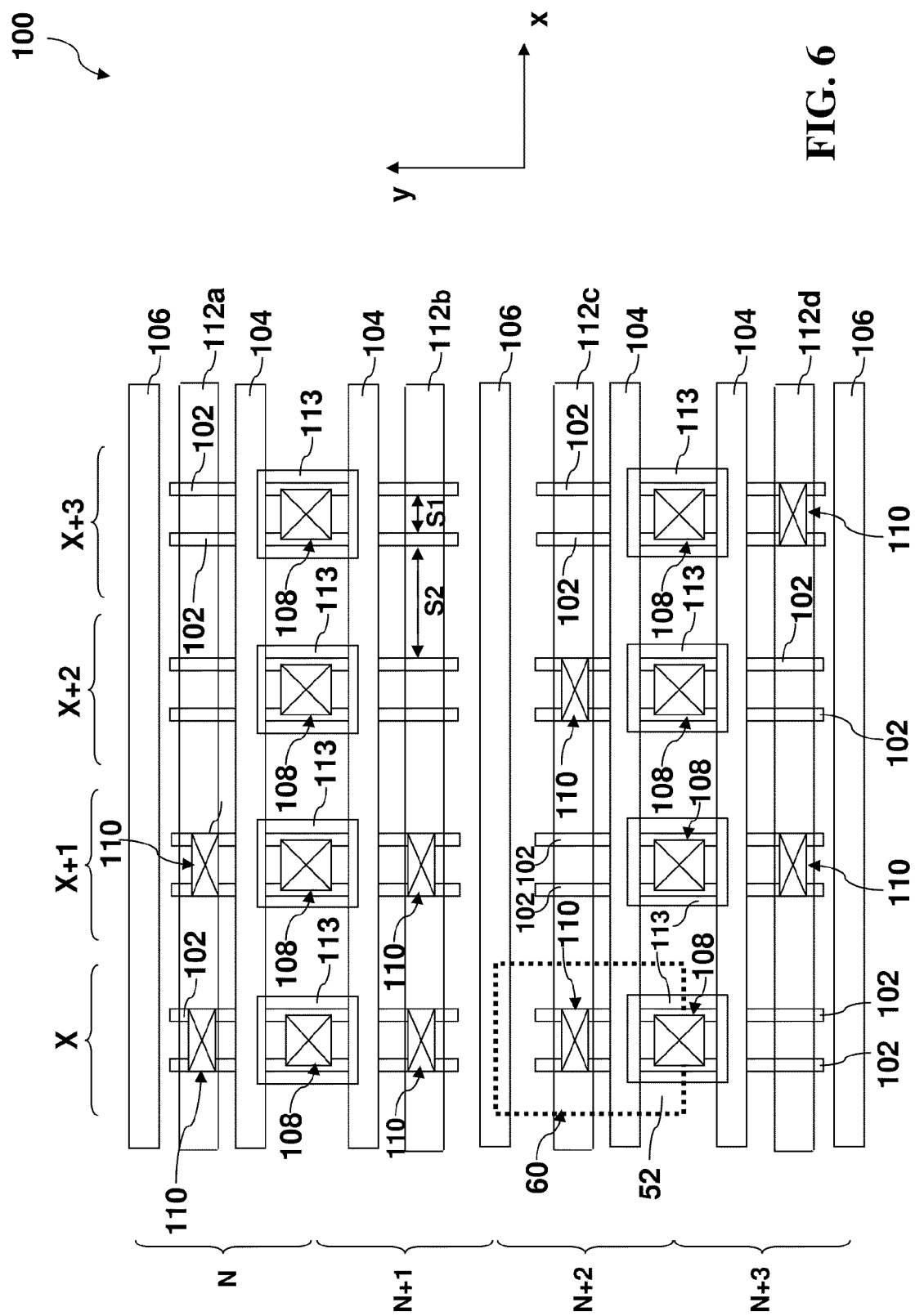

Referring to FIG. 6, the ROM cell array 100 further includes various contacts formed on various ROM features. In one embodiment, the ROM cell array 100 includes drain contacts 108 landing on drains and source contacts 110 landing on sources. The drain contacts 108 and source contacts 110 are designed with different dimensions and/or geometries. The drain contact 108 has a first contact area A1, and the source contact 110 has a second contact area A2 greater than the first contact area A1. In one embodiment, the second contact area A2 is at least 30% greater than the first contact area A1. In the depicted embodiment, the ratio of A2/A1 is greater than 1.3.

The drain contacts 108 are similar to the contacts 62 of FIG. 2 and the source contacts 110 are similar to the contacts 64 of FIG. 2. In the top view, the drain contacts 108 include a first dimension that spans in the gate direction (X direction) and a second dimension that spans in the fin active region direction (Y direction). The first and second dimensions are substantially equal. In other words, the drain contacts 108 have a symmetric geometry in the X and Y directions. For example, the drain contacts 108 include a square geometry in the top view. In another example, the drain contacts 108 include a round shape in the top view. In the top view, the source contacts 110 include a third dimension that spans in the gate direction (X direction) and a fourth dimension that spans in the fin active region direction (Y direction). The third and fourth dimensions are substantially different. Specifically, the third dimension is substantially greater than the fourth dimension. In other words, the source contacts 110 have an asymmetric geometry in the X and Y directions. For example, the source contacts 110 include a rectangle in the top view. In another example, the source contacts 110 include an ellipse shape in the top view. In one embodiment, the ratio between the third dimension and the fourth dimension is greater than 1.5.

The ROM cells are coded to the logic state "1" by forming the source contact, or the logic state "0" by eliminating the source contact. Accordingly, a subset of ROM cells in the ROM cell array 100 include source contacts 110 according to the coding source. Therefore, the contact pattern or contact mask is designed specifically according to a particular ROM coding source. As an example illustrated in FIG. 6, by forming the source contact 110, the ROM cell of X column and N row is coded to the logic "1", and by eliminating the source contact, the ROM cell of X column and N+3 row is coded to the logic "0". Therefore, the ROM cell array 100 is coded by a contact layer defining a plurality of source contacts 110 such that the corresponding ROM cells are coded to the logic "1" and the rest of the ROM cells are coded to the logic "0". Furthermore, a contact photomask is specifically designed according to a particular design of the ROM cell array. The rest of the patterning photomasks are generically designed.

Furthermore, the sources of the FinFETs in one cell are electrically connected together, and the drains of the FinFETs in one cell are electrically connected together. In one embodiment, the intra-cell connections can be achieved by local silicide features. In furtherance of the present embodiment, the semiconductor substrate includes silicon, and the silicide is formed on the sources (and/or drains) to reduce contact resistance. As an epitaxy silicon is formed on the sources (and/or drains), the sources (and/or drains) in one ROM cell are merged together when the shorter space S1 is implemented between adjacent fin active regions within a ROM cell. Thus, a continuous silicide feature is formed on intra-cell sources (and/or drains). In one embodiment, the contact features are formed by a procedure including: depositing a dielectric layer, etching the dielectric layer to form contact holes, and filling the contact holes with a metal, such as tungsten, aluminum, or copper.

Still referring to FIG. 6, the ROM cell array 100 further includes various metal lines formed in a first metal layer and coupled to respective contacts. In the present embodiment, the ROM cell array 100 includes metal lines 112a, 112b, 112c, and 112d configured in parallel and oriented in one direction (such as the X direction parallel with the gates). More particularly, the metal lines 112a through 112d are Vss power lines and are directly connected to the source contacts 110. The sources of the ROM cells having the logic state "1" are electrically coupled to the Vss through the respective source contacts 110 and the metal lines 112. The ROM cell array 100 also includes metal lines 113 connected to the drains contacts 108. The metal lines 113 may be formed in the first metal layer. In an embodiment, the metal lines in the metal layer are formed by a damascene process, such as a single damascene process or a dual damascene process. The metal lines 112a through 112d and 113 include copper when the damascene process is implemented. Alternatively, the metal lines 112a through 112 d and 113 include aluminum, such as aluminum copper (AlCu) alloy formed by metal deposition and metal patterning.

Figure 7:
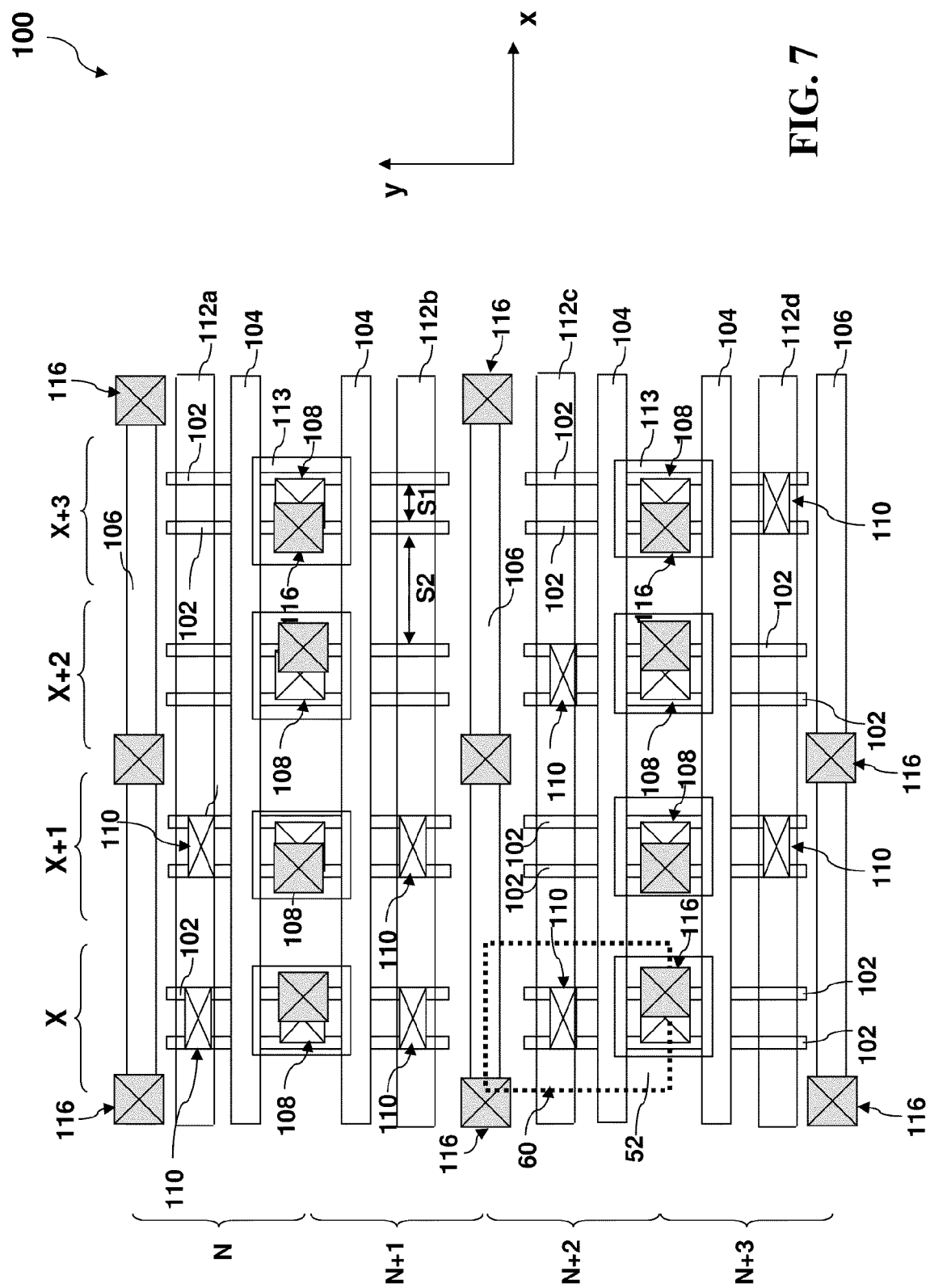

Referring to FIG. 7, the ROM cell array 100 includes various vias 116 configured to connect to various metal lines in the first metal layer. The vias 116 may be formed by a damascene process. For example, the vias 116 are formed by a single damascene process. In another example, the vias 116 are formed by a dual damascene process wherein both the vias and the overlying metal lines are formed. The vias 116 each land on a respective metal line of the first metal layer.

Figure 8:
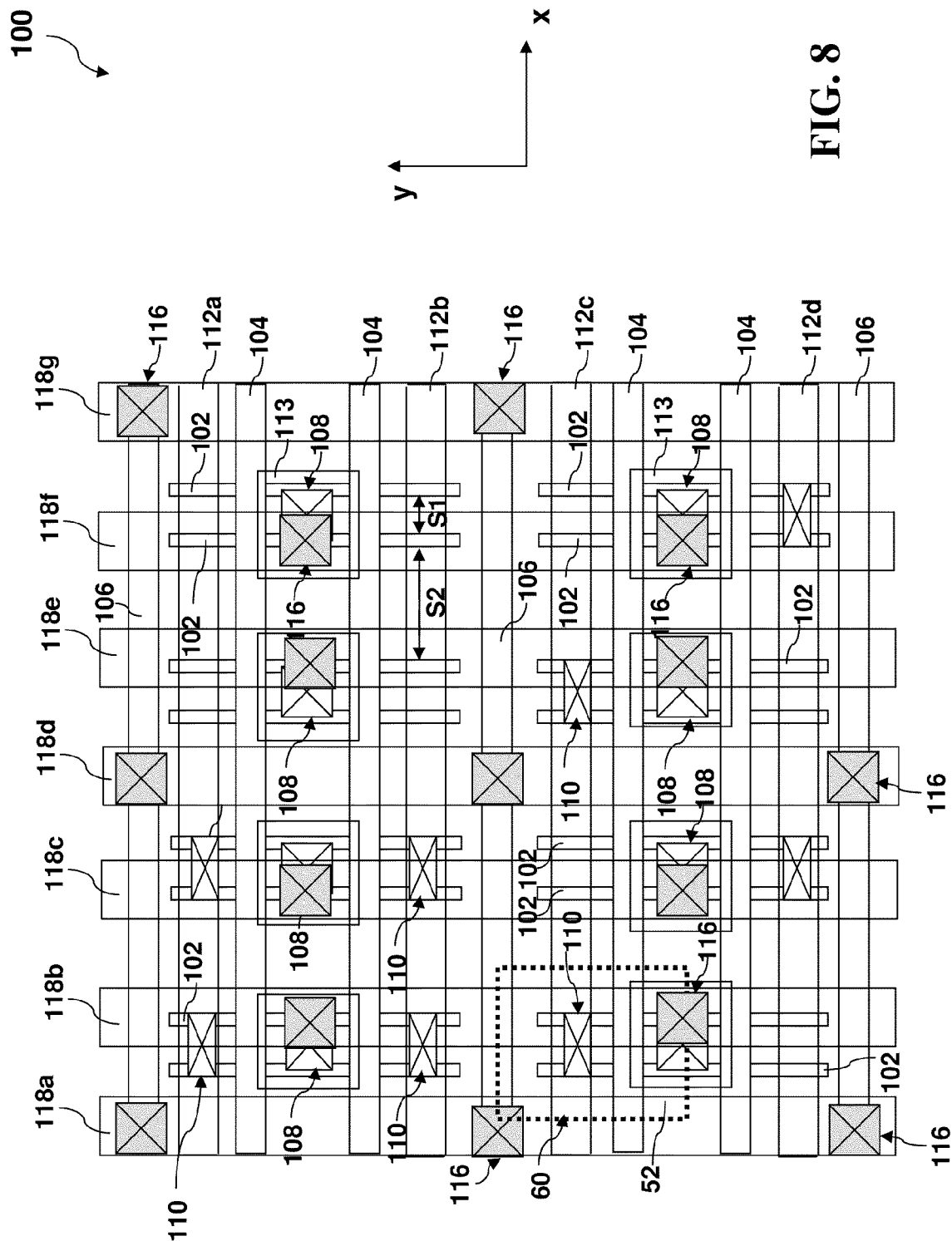

Referring to FIG. 8, the ROM cell array 100 includes various metal lines 118a through 118g configured to connected to various vias 116. The metal lines 118a through 118g are formed in a second metal layer disposed over the first metal layer and coupled to the first metal layer through the vias 116. The metal lines 118a through 118g may be formed by a damascene process similar to the metal lines 112a through 112d in terms of formation and composition. In one example, the metal line 118a is a Vss line and is coupled to the metal lines 112a to 112d through the respective vias 116. In this embodiment, each ROM cell includes two Vss lines oriented in orthogonal directions, formed in different metal layers and electrically coupled together. In another example, the metal line 118b is a bit line and is coupled to the drains of the ROM cells through the respective vias 116, metal lines 113 of the first metal layer, and the drain contacts 108.

Figure 9:
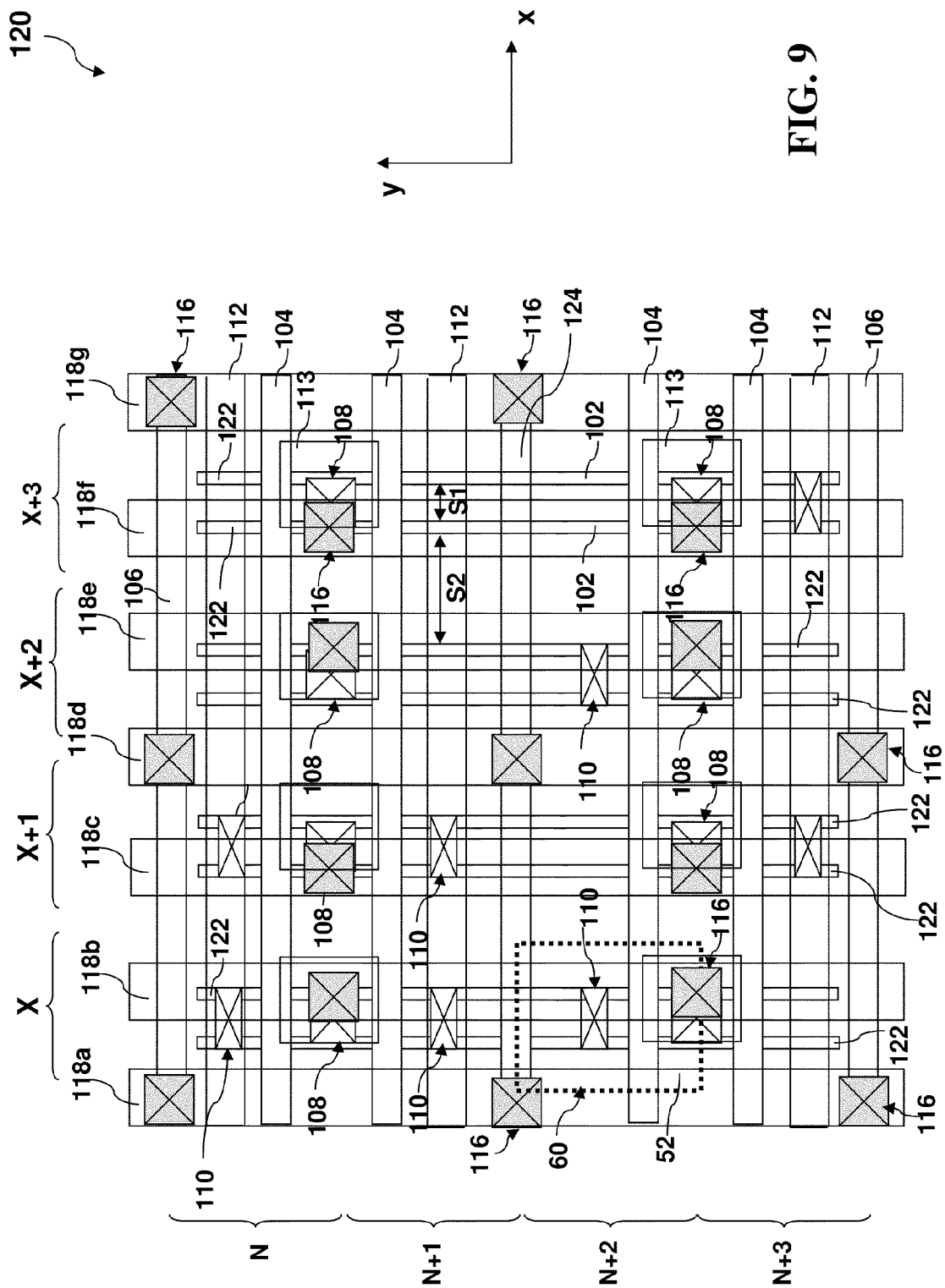
FIG. 9 is a top view of a ROM cell array constructed according to various aspects of the present disclosure in one embodiment.

FIG. 9 is a top view of a ROM cell array 120 constructed according to various aspects of the present disclosure in another embodiment. The ROM cell array 120 is a top view of the ROM cell array 50 in one embodiment. The ROM cell array 120 includes a plurality of ROM cells configured as an array for data storage and access. In the present embodiment, the ROM cells in the ROM cell array 120 are configured in four rows and four columns with a total of 16 ROM cells. The four rows are labeled as "N", "N+1", "N+2", and "N+3", respectively. The four columns are labeled as "X", "X+1", "X+2", and "X+3", respectively. "N" and "X" can be any proper integer numbers. The ROM cell array 120 can be a subset of another large ROM cell array. One exemplary ROM cell is labeled with numeral 52 and has a unit cell boundary 60. Each ROM cell includes multiples FinFETs, such as n-type FinFETs. The ROM cell array 120 is similar to the ROM cell array 100 of FIG. 8 except for the differences discussed below.

The ROM cell array 120 includes a plurality of fin active regions 122. Each ROM cell includes two or more fin active regions disposed within or partially disposed within the cell to form two or more FinFETs in each respective ROM cell. The fin active regions 122 extend along the fin orientation (the Y direction) through multiple ROM cells. In the present embodiment, the fin active regions 122 extend through four ROM cells along the Y direction, and therefore are referred to as continuous fin active regions (or long style fin active regions). In contrast, the fin active regions 102 of FIG. 8 are referred to as short fin active regions (short style fin active regions).

The intra-cell fin active regions 122 are oriented in parallel and configured side by side. In the present embodiment, each ROM cell (such as the ROM cell 52) includes two fin active regions 122, forming two FinFETs in each ROM cell. The fin active regions 122 are oriented in the Y direction and are configured with two difference spaces. A space refers to a distance between two adjacent fin active regions 122 along the X direction. The intra-cell fin active regions 122 include a first space S1, and inter-cell fin active regions 122 include a second space S2. The second space S2 is substantially greater than the first space S1.

The ROM cell array 120 includes a plurality of gates 104 formed on the plurality of fin active regions 122 configured to form various ROM cells. The gates 104 are disposed in parallel and oriented in a direction perpendicular to the fin active regions 122. In the present embodiment, the gates 104 are oriented in the X direction. Each gate may extend to multiple cells. For example, each gate 104 extends through four columns of ROM cells. The ROM cell array 120 further includes dummy gates 106 disposed on the isolation features for pattern uniformity, manufacturing enhancement, and/or device performance improvement. The dummy gates 106 are oriented in the same direction with the functional gates 104.

The ROM cell array 120 includes one or more isolation gates 124 disposed on the continuous fin active regions 122 and configured for isolation. In the present embodiment, the ROM cell array 120 includes one isolation gate 124 orientated perpendicular to the fin active region 122, disposed over various continuous fin active regions 122 and configured to form multiple FinFETs (also referred to as isolation devices), each being associated with one continuous fin active region 122. In furtherance of the present embodiment, the isolation gate 124 is configured and coupled to a grounded potential, such that the corresponding FinFETs are biased to the off-states for electrical isolation. Therefore, the corresponding FinFETs are also referred to as isolation devices.

The functional gates 104, dummy gates 106, and isolation gate 124 each include a gate dielectric layer and a gate electrode disposed on the gate dielectric layer. In one embodiment, the dielectric layer includes silicon oxide and the gate electrode includes doped polysilicon. In another embodiment, the gate dielectric layer includes a high-k dielectric material layer and the gate electrode includes a metal. The gate dielectric layer may further include an interfacial layer, such as a silicon oxide layer. The gate electrode layer may further include a metal or metal alloy layer having a proper work function for the respective FinFET (such as n-type FinFET), such that the FinFET has a minimized threshold voltage and improved device performance. The gates having a high-k dielectric material layer and a metal layer can be formed by a gate-replacement process.

The ROM cell array 120 also includes drain contacts 108 landing on drain(s), and source contacts 110 landing on source(s). The drain contacts 108 are similar to the contacts 62 of FIG. 2, and the source contacts 110 are similar to the contacts 64 of FIG. 2. The drain contacts 108 and source contacts 110 are designed with different dimensions and/or geometries. The drain contact 108 has a first contact area A1, and the source contact 110 has a second contact area A2 greater than the first contact area A1. In one embodiment, the second contact area A2 is at least 30% greater than the first contact area A1. In the present embodiment, the ratio of A2/A1 is greater than 1.3.

Figure 10:
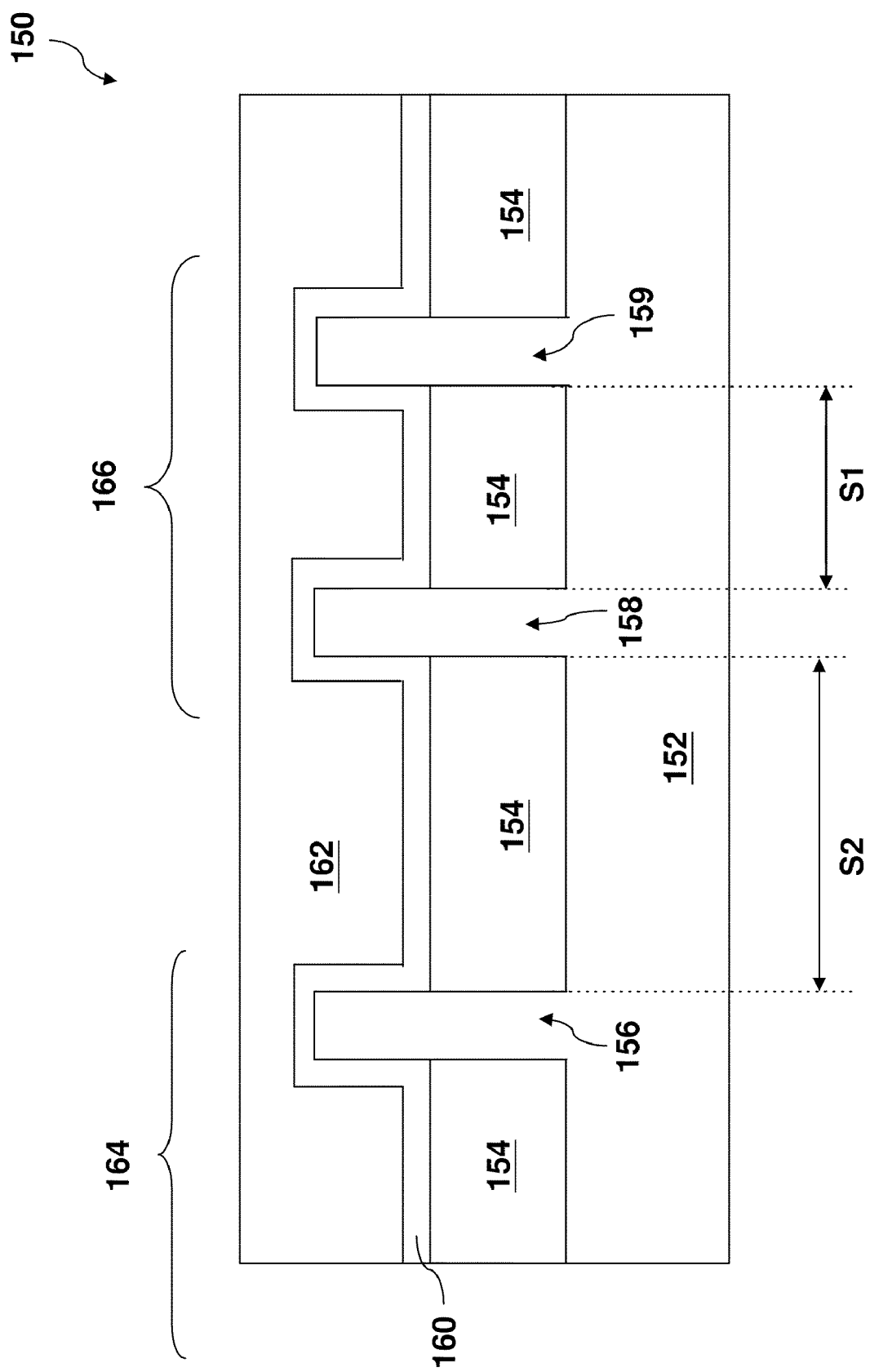
FIG. 10 is a sectional view of a portion of a ROM cell array constructed according to various aspects of the present disclosure in various embodiments.

FIG. 10 is a sectional view of a semiconductor structure 150 as a portion of a ROM cell array constructed according to various aspects of the present disclosure. The semiconductor structure 150 includes a semiconductor substrate 152. The semiconductor substrate 152 includes silicon. Alternatively, the substrate includes germanium, silicon germanium, or other proper semiconductor materials. The semiconductor substrate 152 includes various isolation features 154, such as shallow trench isolation (STI), formed in the substrate to separate various devices. The semiconductor substrate 152 also includes various doped regions, such as n-well and p-wells.

The semiconductor structure 150 includes various fin active regions 156, 158, and 159. The fin active regions 156, 158, and 159 are oriented in parallel. The fin active regions and the STI features can be formed in a processing sequence including forming trenches in the semiconductor substrate 152 and partially filling the trenches with a dielectric material. Alternatively, the trenches are completely filled with the dielectric material. Then, a polishing process, such as chemical mechanical polishing (CMP) process, is applied to remove the excessive dielectric material and planarize the surface. Thereafter, the formed STI features are partially removed to form the fin active regions using a selective etch, such as hydroflouric (HF) wet etch. Particularly, the processing sequence includes etching trenches in the semiconductor substrate 152 and filling the trenches by one or more dielectric materials such as silicon oxide, silicon nitride, silicon oxynitride, or combination thereof. The filled trench may have a multi-layer structure, such as a thermal oxide liner layer with silicon nitride filling the trench. In furtherance of the present embodiment, the STI features are created using a process sequence such as: growing a pad oxide, forming a low pressure chemical vapor deposition (LPCVD) nitride layer, patterning an STI opening using photoresist and masking, etching a trench in the substrate, optionally growing a thermal oxide trench liner to improve the trench interface, filling the trench with CVD oxide, using chemical mechanical planarization (CMP) to etch back, and using nitride stripping to leave the STI structure. In one embodiment, the semiconductor substrate 152 also includes various p-wells formed in various fin active regions.

Various gates are further formed on the fin active regions. A gate feature includes a gate dielectric layer 160 (such as silicon oxide) and a gate electrode 162 (such as doped polysilicon) disposed on the gate dielectric layer 160. In another embodiment, the gate feature alternatively or additionally includes other proper materials for circuit performance and manufacturing integration. For example, the gate dielectric layer 160 may include a high-k dielectric material layer. The gate electrode may include metal, such as aluminum, copper, tungsten, or other proper conductive material. The gate electrode may include a metal having a proper work function for the associated FinFET. For a gate stack including high-k dielectric material and metal, the gate can be formed by a gate-last process or a high-k gate-last process (a complete gate-last process).

In the present embodiment for illustration, the semiconductor substrate 150 includes a first region 164 for a first ROM cell (FIG. 10 only show a portion of the first ROM cell), and a second region 166 for a second ROM cell. Particularly, intra-cell fin active regions include a first space S1, and inter-cell fin active regions includes a second space S2. The second space S2 is substantially greater than the first space S1.

Alternatively, the semiconductor substrate 152 includes a dielectric layer (not shown) embedded therein for isolation, referred to as semiconductor on insulator (SOI). The SOI structure can be formed by a proper technology, such as separation by implanted oxygen (SIMOX) or wafer bonding to include the dielectric layer inside semiconductor material. In one example, the dielectric layer includes silicon oxide.

In another embodiment, the fin active regions include epitaxy features formed in the source/drain regions. In one embodiment, the epitaxy features include a semiconductor material that is the same as the semiconductor substrate, such as silicon. In another embodiment, the epitaxy features formed on two adjacent intra-cell fin active features are merged together due to the lateral epitaxy growth and the short space S1. A silicide may be formed on the merged epitaxy features to electrically connect the sources (and/or drains) of the two adjacent intra-cell fin active regions. In yet another embodiment, the epitaxy features include different semiconductor material(s) for a strained effect.

In various embodiments, the disclosed ROM cell array addresses various issues noted in the background. For example, by adopting asymmetric contact structures, bit-line capacitance and contact resistance on coding side is reduced. Particularly, the drain side of the pass device uses regular (square or round) single contact as the connection path for bit-line to the pass device. The source side of the pass device uses longer contact shapes to reduce contact resistance and improve yield. The asymmetric contact structure provides enhanced cell speed and reduces cell size. In another example, implementing multiple fins with different spaces reduces ROM cell size. Particularly, the multiple fin active regions include a smaller space S1 between the intra-cell adjacent fin active regions and a larger space S2 between the inter-cell adjacent fin active regions. In yet another example, a ROM circuit further includes a strapping cell configured between two ROM cell arrays. The strapping cell includes a first metal line coupled to a strap gate and a second metal line coupled to a strap well region. It is understood that different embodiments may have different advantages, and that no particular advantage is necessarily required of any embodiment.

The foregoing has outlined features of several embodiments. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A read only memory (ROM) cell array comprising:
    a plurality of fin active regions oriented in a first direction and formed on a semiconductor substrate;
    a plurality of gates formed on the plurality of fin active regions and oriented in a second direction perpendicular to the first direction; and
    a plurality of ROM cells formed by the plurality of fin active regions and the plurality of gates, the plurality of ROM cells being coded such that each cell of a first subset of ROM cells has a source electrically connected to a Vss line, and each cell of a second subset of ROM cells has a source electrically isolated,
    wherein each cell of the first subset of ROM cells includes a drain contact having a first contact area and a source contact having a second contact area at least 30% greater than the first contact area.

2. The ROM cell array of claim 1, wherein the source contact includes a first dimension in the first direction and a second dimension in the second direction, the second dimension being at least 30% greater than the first dimension.

3. The ROM cell array of claim 1, wherein the drain contact includes a first contact geometry as one of a square and round shape, and the source contact includes a second contact geometry as one of a rectangle and ellipse shape.

4. The ROM cell array of claim 1, wherein each ROM cell includes more than one fin field-effect transistor (FinFETs).

5. The ROM cell array of claim 1, wherein each ROM cell includes a first Vss line and a second Vss line oriented in orthogonal directions, formed on different metal layers, and electrically coupled together.

6. The ROM cell array of claim 1, wherein each of the plurality of fin active regions extends continuously through more than one ROM cell.

7. A read only memory (ROM) cell array comprising:
    a plurality of fin active regions oriented in a first direction and formed on a semiconductor substrate;
    a plurality of gates formed on the plurality of fin active regions and oriented in a second direction perpendicular to the first direction; and
    a plurality of ROM cells for data storage and formed by the plurality of fin active regions and the plurality of gates, the plurality of ROM cells being coded such that each cell of a first subset of ROM cells has a source electrically connected to a Vss line and each cell of a second subset of ROM cells has a source electrically isolated, each of the plurality of ROM cells including at least two fin field-effect transistors (FinFETs) formed on respective fin active regions and respective cross-points of the fin active regions and the gates, and wherein:

each of the plurality of ROM cells includes a first space between two adjacent intra-cell fin active regions and a second space between two adjacent inter-cell fin active regions, a ratio between the second space and the first space being greater than 1.5; and each of the FinFETs includes a gate electrically connected to a word line, and a drain electrically connected to a bit line.

8. The ROM cell array of claim 7, wherein each cell of the first subset of ROM cells includes a drain contact having a first contact area and a source contact having a second contact area greater than the first contact area.

9. The ROM cell array of claim 8, wherein a ratio between the second contact area and the first contact area is greater than 1.5.

10. The ROM cell array of claim 8, wherein the source contact includes a first dimension in the first direction and a second dimension in the second direction, a ratio between the second dimension and the first dimension being greater than 2.

11. The ROM cell array of claim 7, wherein each ROM cell includes two drains electrically connected by a silicon epitaxy feature, and a silicide feature formed on the silicon epitaxy feature.

12. A read only memory (ROM) cell array comprising:
a plurality of fin active regions oriented in a first direction and formed on a semiconductor substrate;
a plurality of gates formed on the plurality of fin active regions and oriented in a second direction perpendicular to the first direction; and
a plurality of ROM cells for data storage and formed by the plurality of fin active regions and the plurality of gates, the plurality of ROM cells being coded such that each cell of a first subset of ROM cells has a source electrically connected to a Vss line, and each cell of a second subset of ROM cells has a source electrically isolated, and wherein each of the plurality of ROM cells includes:
a first space between two adjacent intra-cell fin active regions and a second space between two adjacent inter-cell fin active regions, the ratio between the second space and the first space being greater than 1.5; and
at least two fin field-effect transistors (FinFETs) formed on respective fin active regions and respective cross-points of the fin active regions and the gates, wherein drains of the at least two FinFETs are electrically connected by a silicide feature formed on a silicon epitaxy feature.

13. The ROM cell array of claim 12, wherein each cell of the first subset of ROM cells includes a drain contact having a first contact area and a source contact having a second contact area greater than the first contact area by at least 30%.

14. The ROM cell array of claim 13, wherein the source contact includes a first dimension in the first direction and a second dimension in the second direction, a ratio between the second dimension and the first dimension being greater than 1.5.

15. The ROM cell array of claim 13, wherein the drain contact includes a first contact geometry as one of a square and round shape, and the source contact includes a second contact geometry as one of a rectangle and ellipse shape.

16. The ROM cell array of claim 12, wherein
each of the plurality of ROM cells includes at least three FinFETs formed on at least three fin active regions, respectively; and
any adjacent two of the at least three fin active regions are configured with the first space.

17. The ROM cell array of claim 12, further comprising an isolation gate disposed on the plurality of fin active regions and electrically connected to a Vss line, thereby forming FinFETs at off-state for isolation.

18. The ROM cell array of claim 12, wherein the plurality of gates include a high-k dielectric material layer and a metal layer disposed on the high-k dielectric material layer.

19. The ROM cell array of claim 12, wherein the ROM cell array is coded by a contact layer defining a plurality of source contacts associated with the first subset of ROM cells.

20. The ROM cell array of claim 12 further comprising a strapping cell configured between the ROM cell array and another ROM cell array, wherein the strapping cell includes a first metal line coupled to a strap gate and a second metal line coupled to a strap well region.

* * * * *